United States Patent [19]

Held

[11] Patent Number: 4,923,389
[45] Date of Patent: May 8, 1990

[54] NEGATIVE WORKING LOW SILVER WASH-OFF CONTACT FILM

[75] Inventor: Robert P. Held, Englishtown, N.J.

[73] Assignee: E. I. Du Pont de Nemours and Company, Wilmington, Del.

[21] Appl. No.: 188,558

[22] Filed: Apr. 29, 1988

[51] Int. Cl.$^5$ .............. G03C 1/06; G03C 1/68; G03C 1/727

[52] U.S. Cl. .................. 430/264; 430/270; 430/281; 430/292

[58] Field of Search .............. 430/270, 281, 292, 264

[56] References Cited

U.S. PATENT DOCUMENTS

| | | | |
|---|---|---|---|
| 3,718,473 | 2/1973 | Gervay et al. | 430/260 |
| 3,904,411 | 9/1975 | Erickson et al. | 430/286 |
| 4,029,509 | 6/1977 | Blake | 96/60 R |
| 4,047,956 | 9/1977 | Blake | 96/60 R |
| 4,124,389 | 11/1978 | Hoornstra | 430/330 |
| 4,174,216 | 11/1979 | Cohen et al. | 430/258 |
| 4,254,210 | 3/1981 | Van Stappen | 430/285 |
| 4,456,676 | 6/1984 | Ciskowski | 430/264 |
| 4,557,997 | 12/1985 | Iwasaki et al. | 430/325 |

FOREIGN PATENT DOCUMENTS 2026186 1/1980 United Kingdom .............. 430/264

OTHER PUBLICATIONS

Plambeck et al., "Camera-Speed Photopolymer Compositions", J. Imaging Science, 1986, 221-223.

*Primary Examiner*—Paul R. Michl
*Assistant Examiner*—Patrick Doody

[57] ABSTRACT

Negative-working, silver wash-off element comprising, in order, (a) support, (b) photosensitive layer comprising silver halide and hydrophilic macromolecular organic polymer dispersion medium including a dispersed phase of a monomer compound and photoinitiator, and (c) an abrasion overcoat layer. In another embodiment, the wash-off element has between the support and abrasion overcoat layer, nearer the support a layer comprising binder, colorant and photosensitive silver halide and a photosensitive layer comprising silver halide and said hydrophilic macromolecular organic polymer dispersion medium including said dispersed phase. The wash-off element is useful for the preparation of half-tone images.

32 Claims, 1 Drawing Sheet

NEGATIVE WORKING LOW SILVER WASH-OFF CONTACT FILM

BACKGROUND OF THE INVENTION

1. Field of the Invention

This invention relates to photosensitive elements. More particularly this invention relates to photosensitive wash-off elements which employ a lesser amount of silver halide than most conventional elements having a silver halide layer containing a crosslinkable photopolymer and optionally a pigment to achieve image density.

2. Description of the Prior Art

A high tinctorial layer of, for example, colloidal silver in conjunction with a layer of photosensitive silver halide to perform image capture is known from Blake U.S. Pat. Nos. 4,029,509 and 4,047,956. The images formed using these inventions depend on the high tinctorial layer for image density, not the silver halide per se. However, these elements still employ considerable silver and the image forming process is difficult to control.

Van Stappen, U.S. Pat. No. 4,254,210 describes the combination of a tonable photopolymer element on one side of the support and a silver halide emulsion layer on the side opposite thereto. Image capture is provided by the silver layer and this image is then used to image the tonable photopolymer layer which provides double the density. This element also uses considerable silver and is designed mainly as an X-Ray element.

None of the aforementioned U.S. Patents teach the use of mixtures of photopolymer and silver halide to obtain a useful photosensitive element. Thus, there is a pressing need for a photosensitive element that can combine the efficiency and speed of a silver halide element with the reasonable cost offered with a photopolymer system.

SUMMARY OF THE INVENTION

In accordance with this invention there is provided a negative-working, silver wash-off element comprising, in order,
(a) a support,
(b) a photosensitive layer comprising silver halide, and a hydrophilic, macromolecular organic polymer dispersion medium, including a dispersed phase containing:
  (i) at least one ethylenically unsaturated monomeric compound having a boiling point above 100° C. at normal atmospheric pressure and being capable of forming a high polymer by free-radical initiated, chain-propagating addition polymerization; and,
  (ii) in reactive association with the monomer, at least one free-radical photoinitiator or photoinitiator system activatible by actinic radiation in an amount constituting from 0.01 to 20% by weight of total solids in the dispersion; and
(c) an abrasion overcoat layer comprising an organic binder and a tanning developer.

In accordance with another embodiment of this invention there is provided a negative-working, silver wash-off element comprising, in order,
(a) a support,
(b) a layer comprising a binder, a colorant, and photosensitive silver halide,
(c) a photosensitive layer comprising silver halide, and a hydrophilic, macromolecular organic polymer dispersion medium including a dispersed phase containing:
  (i) at least one ethylenically unsaturated monomeric compound having a boiling point above 100° C. at normal atmospheric pressure and being capable of forming a high polymer by free-radical initiated, chain-propagating addition polymerization, and
  (ii) in reactive association with the monomer, at least one free-radical photoinitiator or photoinitiator system activatible by actinic radiation in an amount constituting from 0.01 to 20% by weight of total solids in the dispersion, and
(d) an abrasion overcoat layer comprising an organic binder and a tanning developer.

In accordance with still another embodiment of this invention there is provided a process for the preparation of a negative wash-off image from a silver wash-off element comprising,
(a) exposing imagewise to actinic radiation an element comprising in order,
  (1) a support,
  (2) a photosensitive layer comprising silver halide, and a hydrophilic, macromolecular organic polymer dispersion medium, including a dispersed phase containing:
    (i) at least one ethylenically unsaturated monomeric compound having a boiling point above 100° C. at normal atmospheric pressure and being capable of forming a high polymer by free-radical initiated, chain-propagating addition polymerization, and,
    (ii) in reactive association with the monomer, at least one free-radical photoinitiator or photoinitiator system activatible by actinic radiation in an amount constituting from 0.01 to 20% by weight of total solids in the dispersion, and
  (3) an abrasion overcoat layer comprising an organic binder and a tanning developer,
(b) treating the exposed element with a high pH alkaline solution,
(c) washing out the unexposed areas with water at elevated temperature, and,
(d) drying the washed out element.

DETAILS OF THE INVENTION

As described above, preferably a high tinctorial wash-off element suitable for the preparation of half-tone images is obtained. This element is particularly useful in the contact film market where an inexpensive process and element is highly desirable, especially one which will make good, hard dots, for example. Since the process involves wash-out, half-tone dots produced therewith can be easily dot etched further improving the process even more. I know of no prior art that describes such a unique and useful element.

Particularly preferred photopolymer compositions used within the element of this invention are described by Gervay et al., U.S. Pat. No. 3,718,473, and the compositions of this patent, including the various ingredients that make up the element, e.g., monomeric compounds, polymeric binders, photoinitiators, thermal polymerization inhibitors, etc. are incorporated herein by reference. A preferred monomeric compound is trimethylolpropane triacrylate and a preferred photoinitiator is a 2,4,5-triphenylimidazolyl dimer, preferably o-chloro-4,5-bis(m-methoxyphenyl)-imidazolyl dimer. Any of the standard silver halides (e.g. bromide, chloride or iodide or mixtures thereof) conventionally used to prepare photosensitive elements may be used herein. I prefer silver bromide with small amounts of iodide (ca. 2 mole percent, for example). A particularly preferred silver halide emulsion useful within the ambit of this invention includes that used in the bright light elements described in Ciskowski, U.S. Pat. No. 4,456,676, for example, the disclosure of which is incorporated herein by reference. In the single layer embodiment the photosensitive layer contains 5 to 40% by weight, preferably 10 to 32% by weight silver halide (expressed as % metallic silver) and 5 to 50% by weight, preferably 20 to 40% by weight of hydrophilic, macromolecular organic polymer dispersion based on the total weight of solids present in the layer.

Figure 1:
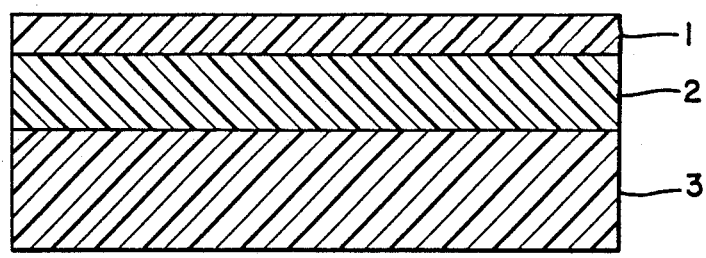
FIG. 1 shows a basic element of this invention in which (1) is an overcoat layer containing developer, (2) is a photosensitive layer containing mixed monomer and initiator, gelatin and silver halide, and optionally a high tinctorial pigment, and (3) is a support.
Figure 2:
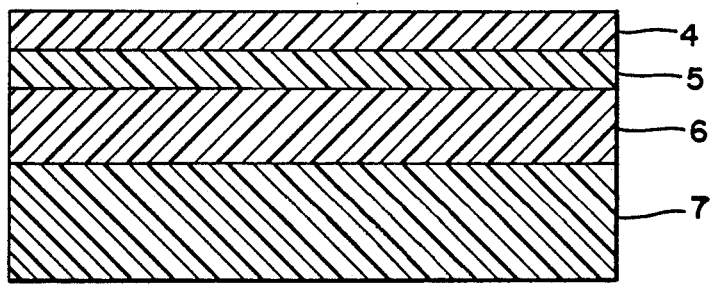
FIG. 2 shows a preferred element of this invention in which (4) is an overcoat layer containing developer, (5) is a layer containing some silver halide, mixed monomer and initiator and gelatin, (6) is a layer containing the balance of the silver halide, gelatin and a high tinctorial pigment, and (7) is a support.

When making a single layer photosensitive element as shown in FIG. 1, I prefer mixing the photopolymer materials described in the above referenced Gervay et at. patent along with the silver halide, some gelatin and a high tinctorial pigment, 2 in FIG. 1. A particularly preferred pigment is finely divided carbon black, for example. This pigment is preferred since the color matches that of developed silver halide most closely. The overcoat layer, 1 in FIG. 1, is preferably polyvinyl alcohol containing a tanning developer, e.g., TTS-5 which is a bis-catechol compound of the formula $C_{21}H_{29}O_4$, which has a CAS No. 77-08-7, Shawnee Chemicals, Springfield, OH, hydroquinone, etc. The weight of developer in the overcoat layer ranges from 5 to 30% by weight, preferably 10 to 20% by weight based on the total weight of the layer. A dispersion of polyethylene particles may be present in the overcoat layer. The layers may be coated in the order shown on any of the conventionally used photographic supports, e.g. dimensionally stable polyethylene terephthalate, 3 in FIG. 1, suitably subbed, etc. Another element embodiment is shown in FIG. 2 wherein overcoat layer 4, photosensitive layer 5, and support 7 are as described above for layers 1, 2 and 3 of FIG. 1, respectively. Between support 7 and photosensitive layer 5 is present a layer 6 comprising a binder such as gelatin, a colorant and photosensitive silver halide. In layer 6 the binder, colorant and photosensitive silver halide, expressed as % metallic silver, are present in 10 to 40%, 20 to 40%, and 5 to 40%, respectively, based on the total weight of the layer.

The element may be exposed in a conventional manner through the overcoat layer using a target image, or other image bearing transparency. After exposure, the element may be developed by processing in a high pH alkaline solution wherein the developer in layer, 1 in FIG. 1, diffuses into the photosensitive layer, 2 in FIG. 1, and crosslinks the binder, e.g., gelatin or gelatino system in the exposed regions. The unexposed regions can then be washed out using water, for example, at elevated temperatures leaving a negative image of the original. If a half-tone dot image is placed thereon, excellent dots can be obtained and the element is eminently useful in the contact film market.

In place of finely divided carbon black any other high tinctorial pigment or dye can be used including other black pigments, dyes, colloidal silver, etc. Where it might be useful to prepare a color master or overlay, for example, other colored pigments may find use such as diarylides for yellow, quinacridine pigments for magenta, and phthalocyanine pigments for cyan. Other colored pigments known to those skilled in the art can also be used. The amount of pigment when present can range from 20 to 40% by weight based on the total weight of the layer in which the colorant is present.

In addition to the layers described above, gel layers may be added under the photosensitive layer or on the opposite side of the support. For example, a gel underlayer containing matte particles therein on the side of the support opposite the photosensitive layer is particularly efficacious when the element of this invention is designed to be exposed in a contact unit. In this particular unit, the master to be exposed therewith is laid in contact with the element of this invention and encased under a glass cover. Vacuum is applied to draw-down and improve contact therewith.

Matte particles, e.g., fine silica, spherical particles of organic polymers, such as polymethylmethacrylate, polystyrene, etc. can be added to the abrasion layer to improve transport or to provide a matte finish thereon. Finally, the layers of this invention may also have wetting or coating aids incorporated therein. Example 2 illustrates a preferred embodiment of the invention.

EXAMPLES

This invention will now be illustrated but not limited by the following examples wherein the percentages are by weight. o-Cl-hexaarylbiimidazole is o-chlorophenyl-4,5-bis(m-methoxyphenyl)imidazolyl dimer. The molecular weights which are number average can be determined by known osmometry techniques.

EXAMPLE 1

This example demonstrates the use of one layer of photosensitive emulsion with no high tinctorial colorant and employing an underlayer.

Underlayer:
The following ingredients were mixed:

| Ingredients | Amount (g) |
| --- | --- |
| Deionized water | 7200 |
| Gelatin | 400 |

These ingredients were cold soaked with stirring for 15 minutes and the temperature increased to 125° F. (~52° C.) and digested 15 minutes. Then, the temperature was lowed to 105° F. (~41° C.) and the following ingredients added:

| Ingredients | Amount (g) |
| --- | --- |
| 5230-3-1 soln. | 200 |
| 5230-3-2 soln. | 200 |

After thoroughly mixing, the weight of the mixture was adjusted to 8000 g with deionized water, the temperature adjusted to 102° F. (~39° C.) and the pH was 5.9.

| 5230-3-1 | Amount (g) |
| --- | --- |
| Aerosol ® OT-75 surfactant made by American Cyanamid, Wayne, NJ | 12.5 |
| Aerosol ® TR-70 anionic surfactant made by American Cyanamid, Wayne, NJ | 12.5 |
| Distilled water | 225.0 |
| 5230-3-2 | |
| FC128 ® anionic fluorocarbon surfactant, (5%), 3M Co., St. Paul, MN | 5.0 |
| Distilled water (Fluorocarbon surfactant) | 100.0 |

Photosensitive Layer:
The following ingredients were blended under yellow safelight conditions:

| Ingredients | Amount (g) |
| --- | --- |
| Deionized water | 1070 |
| Gelatin | 104 |

These ingredients were cold soaked for 15 minutes and then heated to 125° F. (~52° C.) digested 15 minutes and then cooled to 102° F. (~39° C.). Then, were added 1800 g of a silver halide emulsion, a chemically and optically sensitized conventional silver chlorobromide emulsion (ca. 30 mole % bromide), containing about 250 gelatin per mole of silver halide.

The mixture was stirred 10 minutes and to it was added slowly the following:

| Ingredients | Amount (g) |
| --- | --- |
| E187[1] | 180 |
| E193[2] | 260 |
| E188[3] | 168 ml |

These ingredients were stirred for 10 minutes and then the following was added:

| 5230-3-3[4] | 2084 |
| --- | --- |

After stirring 10 minutes the following were added:

| 5230-3-2 soln. described above | 200 |
| --- | --- |
| 5230-3-1 soln. described above | 100 |

After stirring 10 minutes more, the entire mixture was held at 102° F. (~39° C.) for coating. The analysis was 2.9% silver bromide.
1. Acrysol ® WS-50 acrylic latex made by Rohm & Haas Co., Philadelphia, PA
2. 8% polyethylene oxide molecular weight 1000, 6% benzenesulfinic acid in distilled water (hereinafter (PEO/BS)
3. 4-acetylaminophenol, 14% in ethanol (hereinafter (4AAP)
4. A mixture of 75 g distilled water, 4.5 g gelatin, 1.0 g 10% saponin in water, 0.4 g Triton ® QS-44, phosphate ester, Rohm & Haas Co., Philadelphia, PA, and 1.0 g of polyvinylpyrrolidone (40% in water) was blended together with a solution of:

| Ingredients | Amount (g) |
| --- | --- |
| Trimethylolpropane triacrylate | 7.5 |
| Plasthall ®4141, Plasticizer made by C. P. Hall Co., Chicago, IL | 1.6 |
| o-chloro-hexaarylbiimidazole | 1.6 |
| Benzophenone | 0.6 |
| Michler's ketone | 0.1 |
| Methylene chloride | 10.0 |

Overcoat Layer:
The following were mixed:

| Ingredients | Amount (g) |
| --- | --- |
| Deionized water | 7250 |
| Polyvinyl alcohol | 400 |

These ingredients were cold soaked with stirring for 10 minutes and then heated to 195° F. (~90° C.) with slow stirring. After digesting at this temperature for 60 minutes, the mixture was cooled to 105° F. (~41° C.) and the following were added thereto:

| Ingredients | Amount (g) |
| --- | --- |
| Add slowly 370 g of a mixture of: | |
| Polyvinylpyrrolidone | 200 |
| Naccanol ®90F, nonionic surfactant Stepan Chemical Co., Northfield, IL | 175 |
| Brij ®30 polyoxyethylene-4-lauryl ether, ICI Americas, Inc., Wilmington, DE | 100 |
| TTS-5 Solid, tanning developer, described above | 400 |
| Water | 1875 |
| Add 204 g of a 40% aqueous solution of a polyethylene bead dispersion (Poligen ®PE, BASF Wyandotte Corp., Holland, MI) with rapid stirring followed by: | |
| 5230-3-1 soln. described in Ex. 1 | 120 |
| 5230-3-2 soln. described in Ex. 1 | 740 |

After cooling to 102° F. (~39° C.), the weight was adjusted to 9090 g total weight with deionized water and the pH adjusted to 6.6 with 1N NaOH or 1N H$_2$SO$_4$.

To prepare an element representing this invention, a strip of 0.004 inch (0.1 mm) dimensionally stable polyethylene terephthalate film, subbed on both sides with a conventional resin sub and a thin substratum of hardened gelatin, was coated in order with the above referenced underlayer composition (coated at 3.2 mg gel/dm$^2$) followed by the photosensitive composition (coated at 4.0 mg AgBr/dm$^2$) and the overcoat composition applied supra thereto (coated at 4.0 mg PVA/dm$^2$). All coatings were done using a standard web coated at 150 feet/minute (45.72 m/minute). After thoroughly drying, a sample of this element was exposed in a vacuum frame to a mercury arc lamp at 5000 watts through a test target that included half-tone dot patterns. Exposure was for 4 units (ca. 10 seconds). After exposure, the film was developed by dipping in an aqueous alkaline solution (pH 11) and water washed at 40° C. yield a high quality image with very little color, since no high tinctorial pigment was present therein.

EXAMPLE 2

This example demonstrates a multilayer coating with carbon black as the high tinctorial colorant.

The following mixtures were prepared:
Mixed Organic (OR)/Aqueous (AQ) Silver Layer:

| Ingredients | Amount (g) | Phase |
|---|---|---|
| Deionized water | 75.0 | AQ |
| Gelatin | 5.0 | AQ |
| Polyvinyl alcohol | 1.9 | AQ |
| Triton ® QS44, phosphate ester, Rohm & Haas Co., Philadelphia, PA | 0.4 | AQ |
| Saponin (10% in water) | 1.0 | AQ |
| Trimethylolpropane triacrylate | 7.6 | OR |
| o-Cl-hexaarylbiimidazole | 1.6 | OR |
| Benzophenone | 0.6 | OR |
| Michler's ketone | 0.1 | OR |
| Methylene chloride | 10.0 | OR |

The gelatin was soaked in the water for 15 minutes at ambient temperature followed by digestion at 40° F. (~5° C.) for 15 minutes. The remainder of the aqueous phase ingredients were then added to the gelatin at 40° C. The remainder of the organic phase were added with stirring at 40° F. (~5° C.) for 5 minutes until a fully blended, composite photosensitive material was obtained. All of this was done under yellow safe lights.

A gelatin mixture was prepared from the following:

| Ingredients | Amount (g) |
|---|---|
| Deionized water | 165.0 |
| Gelatin | 4.7 |
| Silver halide emulsion described in Ex. 1 | 90.0 |
| Acrysol ® WS50 acrylic latex, Rohm & Haas Co., Philadelphia, PA | 5.0 |
| PEO/BS described in Ex. 1 | 13.0 |
| 4AAP described in Ex. 1 | 8.4 ml |

As described above, the gelatin was soaked and then dispersed. The remainder of the ingredients were added and fully dispersed therein at 40° F. (~5° C.) for 5 minutes. Both of the above described solutions were then combined along with 10 ml of the FC-128 ® anionic fluorocarbon surfactant (5%), 3M Co., St. Paul, MN, and 5 ml of the 5230-3-1 solution described in Ex. 1. This combination then became the mixed photopolymer/silver halide photosensitive emulsion.

Silver Halide/Carbon Black Emulsion:
The following ingredients were mixed:

| Ingredients | Amount (g) |
|---|---|
| Deionized water | 240.0 |
| Gelatin | 9.8 |
| Silver halide emulsion described in Ex. 1 | 90.0 |
| Acrysol ® WS50 acrylic latex Rohm & Haas Co., Philadelphia, PA | 5.0 |
| 4AAP described in Ex. 1 | 8.4 |
| Carbon black dispersion, mixed together before adding: | 55.0 |
| Water | 50.0 |
| FC128 ® anionic fluorocarbon surfactant (5%), 3M Co., St. Paul, MN | 10.0 ml |
| 5230-3-1 soln. described in Ex. 1 | 5.0 ml |

The carbon black dispersion is similar to that described in Example 1 of Ciscowski U.S. Pat. No. 4,456,676. As described previously, the gelatin was soaked in the water first at ambient temperatures followed by complete dispersion at 40° F. (~5° C.) for 15 minutes. The remainder of the ingredients were then fully dispersed therein to give a mixture which contains silver halide and carbon black as the high tinctorial pigment. To complete the element, the support was a 0.004 inch (0.1 mm) polyethylene terephthalate film having conventional resin sub on both sides and thin substratum of gelatin coated supra thereto. The silver halide/carbon black emulsion was coated first using a 0.002 inch (0.051 mm) doctor knife followed by the photopolymer/silver halide emulsion. An overcoat layer as described in Example 1 was placed thereon by coating in a similar manner as described. After drying, a sample of this element was exposed as described in Example 1. An excellent, high quality, high density image was obtained with superb dot quality.

EXAMPLE 3

The following emulsion was prepared under yellow safelights:

| Ingredients | Amount (g) |
|---|---|
| Deionized water | 165.0 |
| Gelatin | 5.2 |
| Silver halide emulsion described in Ex. 1 | 90.0 |
| Acrysol ® WS50 acrylic latex, Rohm & Haas Co., Philadelphia, PA | 5.0 |
| PEO/BS described in Ex. 1 | 13.0 |
| 4AAP described in Ex. 1 | 8.4 ml |

The gelatin was cold soaked in the water at ambient temperature for 15 minutes and then dispersed with stirring at 40° F. (~5° C.) for 15 minutes. After this time, the remainder of the ingredients were added with stirring at 40° F. (~5° C.) until all was dispersed satisfactorily, as described above previously. Then, the following was prepared:

Aqueous Phase:

| Ingredients | Amount (g) |
|---|---|
| Deionized water | 75.0 |
| Gelatin | 4.5 |
| Polyvinylpyrrolidone | 1.9 |
| Triton ® QS44 phosphate ester, Rohm & Haas Co., Philadelphia, PA | 0.4 |
| Saponin (10% Aqueous Soln.) | 1.0 |

The gelatin was soaked and dispersed as previously described and the remainder of the ingredients added in the normal manner.

Organic Phase:

| Ingredients | Amount (g) |
|---|---|
| Trimethylolpropane triacrylate | 7.5 |
| Plasthall ®4141, C. P. Hall Co., Chicago, IL | 1.6 |
| o-Cl-hexaarylbiimidazole | 1.0 |
| Benzophenone | 0.6 |
| Michler's ketone | 0.1 |
| Methylene chloride | 10.0 |

After thoroughly mixing, the organic and aqueous phases were combined and blended together for 5 minutes. At this time, the combined phases were mixed with the silver halide emulsion containing solution using yellow safelights and a mixture of the following ingredients was added thereto:

| Ingredients | Amount (g) |
| --- | --- |
| Finely divided carbon black | 55 |
| Deionized water mixed together before adding: | 50 |
| FC128 ® anionic fluorocarbon surfactant (5%), 3M Co., St. Paul, MN | 10 |
| 5230-3-1 soln. described in Ex. 1 | 5 ml |

A coating representing this invention was then made using a 0.002 inch (0.051 mm) doctor knife on resin/gel subbed 0.004 inch (0.1 mm) dimensionally stable polyethylene terephthalate film base to give an element which had a support, a clear gel underlayer, a photosensitive layer of the above mentioned ingredients and an overcoat layer as described in Example 1. A sample of this element was exposed as previously described and the resulting image, after development and wash-out, had excellent dots.

EXAMPLE 4

The following silver halide emulsion was prepared under yellow safelights:

| Ingredients | Amount (g) |
| --- | --- |
| Deionized water | 240.0 |
| Gelatin | 9.8 |
| Silver halide emulsion described in Ex. 1 | 90.0 |
| Acrysol ® WS50 acrylic latex, Rohm & Haas Co., Philadelphia, PA | 5.0 |
| PEO/BS described in Ex. 1 | 13.0 |
| 4AAP described in Ex. 1 | 8.4 ml |
| Finely divided carbon black | 55.0 |
| Deionized water mixed together before adding: | 50.0 |
| FC128 ® anionic fluorocarbon surfactant (5%), 3M Co., St. Paul, MN | 10.0 ml |
| 5230-3-1 soln. described in Ex. 1 | 5.0 ml |

The gelatin was soaked and dispersed in the water as previously described before adding the remainder of the ingredients.

A photopolymer emulsion was made by mixing the following aqueous and organic phases together:

Aqueous Phase:

| Ingredients | Amount (g) |
| --- | --- |
| Deionized water | 75.0 |
| Gelatin | 4.5 |
| polyvinylpyrrolidone (40% in water) | 1.9 |
| Triton ® QS44 phosphate ester, Philadelphia, PA | 0.4 |
| Saponin (10% aqueous soln.) | 1.0 |

The gelatin was soaked and dispersed in the water as previously described before the remainder of the ingredients were added.

Organic Phase:

| Ingredients | Amount (g) |
| --- | --- |
| TEOTA monomer[1] | 7.5 |
| Plasthall ® 4141, C. P. Hall Co., Chicago, IL | 1.6 |
| o-Cl-hexaarylbiimidazole | 1.6 |
| Benzophenone | 0.6 |
| Michler's ketone | 0.1 |
| Methylene chloride | 10.0 |

[1]trimethylolpropane triacrylate/ethylene glycol adduct (molecular weight 1000)

Another silver halide emulsion was made from the following ingredients:

| Ingredients | Amount (g) |
| --- | --- |
| Deionized water | 75.0 |
| Gelatin | 5.3 |
| Silver halide emulsion described in Ex. 1 | 90.0 |
| Acrysol ® WS50 acrylic latex, Rohm & Haas Co., Philadelphia, PA | 5.0 |
| PEO/BS described in Ex. 1 | 13.0 |
| 4AAP described in Ex. 1 | 8.4 ml |

Again, the gelatin was soaked and redispersed first as previously described before the remainder of the ingredients were added. This silver halide emulsion was added to the photopolymer emulsion along with 10 ml of FC128 ® anionic fluorocarbon surfactant (5%), 3M Co., St. Paul, MN, and 5 ml of 5230-3-1 solution described in EX. 1.

A coating representing this invention was made using a 0.002 inch (0.051 mm) doctor knife on resin/gel subbed 0.004 inch 0.1 mm) dimensionally stable polyethylene terephthalate film base to yield an element comprising a support, a clear gel underlayer, the first silver halide emulsion described above, the photopolymer/silver halide combination described above, and an overcoat layer as described in Example 1. A sample of this element was exposed, developed and washed-out as previously described. Dots of superb quality were obtained therefrom.

EXAMPLE 5

An overcoat solution was made from the following ingredients:

| Ingredients | Amount (g) |
| --- | --- |
| Deionized water | 600 |
| Polyvinyl alcohol | 30 |
| Hydroquinone dispersion[1] | 28 |
| Polyethylene bead dispersion described in Ex. 1 | 15 |

[1]Hydroquinone dispersion is a mixture of

| Ingredients | Amount (g) |
| --- | --- |
| Polyvinylpyrrolidone (40% in H₂O) | 50 |
| Distilled water | 155 |
| Aerosol ® OT-75 surfactant, American Cyanamide, Wayne, NJ | 20 |
| Brij ® 30 polyoxyethylene 4-lauryl ether, ICI Americas, Inc., Wilmington, DE | 10 |
| Hydroquinone | 40 |

The polyvinyl alcohol was dispersed in the water first at 190° F. (~88° C.) for 30 minutes with stirring before adding the remainder of the ingredients. The total weight of this solution was 673 g.

A coating representing this invention was made using a 0.002 inch (0.051 mm) doctor knife on resin/gel subbed 0.004 inch (0.1 mm) dimensionally stable polyethylene terephthalate film base so that the following structure was obtained:
1. The support 2. A clear gel undercoat
3. A silver halide/carbon black/gel layer similar to that described in Example 2.
4. A photopolymer/silver halide layer (clear) similar to that described in Example 2.
5. The overcoat layer of this example.

A sample from this element was exposed, developed and washed-out as previously described. Dots of superior quality were obtained.

EXAMPLE 6

A solution was made from the following:

| Ingredients | Amount (g) |
| --- | --- |
| Deionized water | 320.0 |
| Gelatin | 12.5 |
| Acrysol ® WS50 acrylic latex, Rohm & Haas Co., Philadelphia, PA | 5.0 |
| PEO/BS described in Ex. 1 | 13.0 |
| 4AAP described in Ex. 1 | 8.4 ml |

Per usual, the gelatin was soaked and redispersed in the water as previously described before the remainder of the ingredients were added.

A silver halide emulsion solution was made from the following:

| Ingredients | Amount (g) |
| --- | --- |
| Deionized water | 165.0 |
| Gelatin | 5.2 |
| Silver halide emulsion described in Ex. 1 | 90.0 |
| Acrysol ® WS50 acrylic latex, Rohm & Haas Co., Philadelphia, PA | 5.0 |
| PEO/BS described in Ex. 1 | 13.0 |
| 4AAP described in Ex. 1 | 8.4 ml |
| Finely divided carbon black | 55.0 |
| Water | 50.0 |
| mixed together before adding: | |
| FC128 ® anionic fluorocarbon surfactant (5%), 3M Co., St. Paul, MN | 10.0 |
| 5230-3-1 soln. described in Ex. 1 | 5.0 |

The gelatin was dispersed as usual before adding the remainder of the ingredients.

A photopolymer solution was made from a mixture of the following aqueous and organic phases:

Aqueous Phase:

| Ingredients | Amount (g) |
| --- | --- |
| Deionized water | 75.0 |
| Gelatin | 4.5 |
| Polyvinyl pyrrolidone | 1.9 |
| Triton ® QS44 phosphate ester, Rohm & Haas Co., Philadelphia, PA | 0.4 |
| Saponin (10% aqueous soln.) | 1.0 |

Organic Phase:

| Ingredients | Amount (g) |
| --- | --- |
| Trimethylolpropane triacrylate | 7.5 |
| Plasthall ® 4141, C. P. Hall Co., Chicago, IL | 1.6 |
| o-Cl-hexaarylbiimidazole | 1.6 |
| Benzophenone | 0.6 |
| Michler's ketone | 0.1 |
| Methylene chloride | 10.0 |

After thoroughly mixing these ingredients, the organic and aqueous phases were mixed and then this mixture was mixed with the silver halide emulsion along with 10 ml of FC128 ® anionic fluorocarbon surfactant (5%), 3M Co., St. Paul, MN and 5 ml of 5230-3-1 solution described in Ex. 1.

An element representing this invention was made by coating using a 0.002 inch (0.0051 mm) doctor knife on 0.004 inch (0.1 mm) dimensionally stable polyethylene terephthalate film having a resin/gel sub thereon, to yield the following structure:
1. a support
2. a gel underlayer
3. a gel/carbon black layer
4. a photopolymer/silver halide layer
5. an overcoat (layer as described in Example 1)

A sample of this element was exposed, developed and washed-out as previously described. Dots of excellent quality were obtained.

EXAMPLE 7

The following silver halide emulsion solution was made:

| Ingredients | Amount (g) |
| --- | --- |
| Deionized water | 165.0 |
| Gelatin | 5.2 |
| Silver halide emulsion described in Ex. 1 | 90.0 |
| Acrysol ® WS50 acrylic latex, Rohm & Haas Co., Philadelphia, PA | 5.0 |
| PEO/BS described in Ex. 1 | 13.0 |
| 4AAP described in Ex. 1 | 8.4 ml |

As usual, the gelatin was dispersed in the water prior to adding the other ingredients, as previously described.

A photopolymer solution was made by mixing the following aqueous and organic phases:

Aqueous phase:

| Ingredients | Amount (g) |
| --- | --- |
| Deionized water | 75.0 |
| Gelatin | 4.5 |
| Polyvinyl pyrrolidone | 1.9 |
| Triton ® QS44 phosphate ester, Rohm & Haas Co., Philadelphia, PA | 0.4 |
| Saponin (10% aqueous soln.) | 1.0 |

Organic Phase:

| Ingredients | Amount (g) |
| --- | --- |
| Trimethylolpropane triacrylate | 7.5 |
| Plasthall ® 4141, C. P. Hall Co., Chicago, IL | 1.6 |
| o-Cl-hexaarylbiimidazole | 1.6 |
| Benzophenone | 0.6 |
| Michler's ketone | 0.1 |
| Methylene chloride | 10.0 |
| Acetyl Yellow Dye, C. I. Solvent Yellow 83 | 1.0 |
| Acetone | 40.0 |

After mixing the above ingredients in the usual manner, the organic and aqueous phases were then blended together, along with 10 ml of FC-128 ® anionic fluorocarbon surfactant (5%), 3M Co., St. Paul, MN, 5 ml of 5230-3-1 solution described in Example 1 and a silver halide emulsion solution made as described above. An element representing this invention was made by coating using a 0.002 inch (0.051 mm) doctor knife on 0.004 inch (0.1 mm) resin/gel subbed, dimensionally stable polyethylene terephthalate film to give the following structure:
1. a support
2. a gel underlayer
3. a single photosensitive layer containing photopolymer, silver halide and yellow dye colorant
4. an overcoat layer as described in: Example 1

A sample of this element was then exposed, developed and washed-out as previously described. Good dots, with a yellow color, were obtained.

EXAMPLE 8

The following solutions were made:
Carbon Containing Solution:

| Ingredients | Amount (g) |
|---|---|
| Deionized water | 150 |
| Carbopol ® 934[1] | 2 |
| Finely divided carbon black | 55 |
| Deionized water | 50 |
| mixed together before adding: | |
| FC128 ® anionic fluorocarbon surfactant (5%), 3M Co., St. Paul, MN | 10 |
| 5230-3-1 soln. described in Ex. 1 | 5 ml |

[1] High molecular weight carboxy vinyl polymer, B. F. Goodrich Co., Akron, OH.

Silver Halide Emulsion Solution:

| Ingredients | Amount (g) |
|---|---|
| Deionized water | 165.0 |
| Gelatin | 5.2 |
| Silver halide emulsion described in Ex. 1 | 90.0 |
| Acrysol ® WS50 acrylic latex, Rohm & Haas Co., Philadelphia, PA | 5.0 |
| PEO/BS described in Ex. 1 | 13.0 |
| 4AAP described in Ex. 1 | 8.4 ml |

Photopolymer Solution
Aqueous Phase:

| Ingredients | Amount (g) |
|---|---|
| Deionized water | 75.0 |
| Gelatin | 4.5 |
| Poyvinyl alcohol | 1.9 |
| Triton ® QS44 phosphate ester, Rohm & Haas Co., Philadelphia, PA | 0.4 |
| Saponin (10% aqueous soln.) | 1.0 |

Organic Phase:

| Ingredients | Amount (g) |
|---|---|
| Trimethylolpropane triacrylate | 7.5 |
| Plasthall ® 4141, C. P. Hall Co., Chicago, IL | 1.6 |
| o-Cl-hexaarylbiimidazole | 1.6 |
| Benzophenone | 0.6 |
| Michler's ketone | 0.1 |
| Methylene chloride | 10.0 |

The organic and aqueous phases were blended and then mixed with the silver halide emulsion solution including 10 ml of FC-128 ® anionic fluorocarbon surfactant (5%), 3M Co., St. Paul, MN, and 5 ml of 5230-3-1 solution described in Example 1.

An element representing this invention was prepared by coating using a 0.002 inch (0.051 mm) doctor knife on 0.004 inch (0.1 mm), resin/gel subbed, dimensionally stable polyethylene terephthalate film to give the following structure:
1. a support
2. a gel underlayer
3. a carbon-containing layer using an alternate binder
4. a photosensitive layer containing photosensitive/silver halide
5. an overcoat layer as described in Example 1.

A sample of this element was exposed, developed and washed-out as previously described. Dots of very good quality were obtained indicating that alternate binders are useful in this invention.

I claim:

1. A negative-working, silver wash-off element comprising, in order,
   (a) a support,
   (b) a photosensitive layer consisting essentially of an aqueous phase containing silver halide, and a hydrophilic, macromolecular organic polymer dispersion medium, and an organic dispersed phase containing:
      (i) at least one ethylenically unsaturated monomeric compound having a boiling point above 100° C. at normal atmospheric pressure and being capable of forming a high polymer by free-radical initiated, chain-propagating addition polymerization; and,
      (ii) in reactive association with the monomer, at least one free-radical photoinitiator or photoinitiator system activatible by actinic radiation in an amount constituting from 0.01 to 20% by weight of total solids in the dispersion; and
   (c) an abrasion overcoat layer comprising an organic binder and a tanning developer.

2. An element according to claim 1 wherein a colorant is present in the photosensitive layer.

3. An element according to claim 2 wherein the colorant is carbon black.

4. An element according to claim 1 wherein between support (a) and photosensitive layer (b) is present a gel layer.

5. An element according to claim 1 wherein on support (a) is present as an underlayer a matte-containing gel layer.

6. An element according to claim 1 wherein a dispersion of polyethylene particles is present in the overcoat layer.

7. An element according to claim 1 wherein the macromolecular organic polymer is gelatin.

8. An element according to claim 1 wherein the monomeric compound is trimethylolpropane triacrylate.

9. An element according to claim 1 wherein the photoinitiator is a 2,4,5-triphenylimidazolyl dimer.

10. An element according to claim 9 wherein the dimer is o-chlorophenyl-4,5-bis(m-methoxyphenyl)imidazolyl dimer.

11. An element according to claim 1 wherein the photosensitive layer contains 5 to 40% by weight silver halide, expressed as % metallic silver, and 5 to 50% by weight hydrophilic, macromolecular organic polymer dispersion based on the total weight of solids present in the layer.

12. An element according to claim 1 wherein 5 to 30% by weight of developer is present in the overcoat layer based on the total weight of the layer.

13. A negative-working, silver wash-off element comprising, in order,
(a) support,
(b) a layer comprising a binder, a colorant, and photosensitive silver halide,
(c) a photosensitive layer consisting essentially of an aqueous phase containing silver halide, and a hydrophilic, macromolecular organic polymer dispersion medium and an organic dispersed phase containing:
   (i) at least one ethylenically unsaturated monomeric compound having a boiling point above 100° C. at normal atmospheric pressure and being capable of forming a high polymer by free-radical initiated, chain-propagating addition polymerization, and
   (ii) in reactive association with the monomer, at least one free-radical photoinitiator or photoinitiator system activatible by actinic radiation in an amount constituting from 0.01 to 20% by weight of total solids in the dispersion; and
(d) an abrasion overcoat layer comprising an organic binder and a tanning developer.

14. An element according to claim 13 wherein the colorant is carbon black.

15. An element according to claim 13 wherein between support (a) and layer (b) is present a gel layer.

16. An element according to claim 13 wherein on support (a) is present as an underlayer a matte-containing gel layer.

17. An element according to claim 13 wherein a dispersion of polyethylene particles is present in the overcoat layer.

18. An element according to claim 13 wherein the macromolecular organic polymer is gelatin.

19. An element according to claim 13 wherein the monomeric compound is trimethylolpropane triacrylate.

20. An element according to claim 13 wherein the photoinitiator is a 2,4,5-triphenylimidazolyl dimer.

21. An element according to claim 20 wherein the dimer is o-chlorophenyl-4,5-bis(m-methoxyphenyl)-imidazolyl dimer.

22. An element according to claim 13 wherein in layer (b) the binder, colorant and photosensitive silver halide, expressed as % metallic silver, are present in 10 to 40%, 20 to 40% and 5 to 40% by weight, respectively, based on the total weight of the layer.

23. An element according to claim 22 wherein in layer (c) the silver halide and hydrophilic macromolecular organic polymer dispersion are present in 5 to 40%, expressed as % metallic silver, and 5 to 50% by weight, respectively, based on the total weight of solids present in the layer.

24. An element according to claim 13 wherein 5 to 30% by weight of developer is present in the overcoat layer based on the total weight of the layer.

25. A process for the preparation of a negative wash-off image from a silver wash-off element comprising
(a) exposing imagewise to actinic radiation an element comprising in order,
   (1) a support,
   (2) a photosensitive layer consisting essentially of an aqueous phase containing silver halide, and a hydrophilic, macromolecular organic polymer dispersion medium, and an organic dispersed phase containing:
      (i) at least one ethylenically unsaturated monomeric compound having a boiling point above 100° C. at normal atmospheric pressure and being capable of forming a high polymer by free-radical initiated, chain-propagating addition polymerization, and
      (ii) in reactive association with the monomer, at least one free-radical photoinitiator or photoinitiator system activatible by actinic radiation in an amount constituting from 0.01 to 20% by weight of total solids in the dispersion; and
   (3) an abrasion overcoat layer comprising an organic binder and a tanning developer.
(b) treating the exposed element with a high pH alkaline solution,
(c) washing out the unexposed areas with water at elevated temperature, and
(d) drying the washed out element.

26. A process according to claim 25 wherein a colorant is present in the photosensitive layer.

27. A process according to claim 26 wherein the colorant is carbon black.

28. A process according to claim 25 wherein the element contains a layer comprising a binder, a colorant and photosensitive silver halide between the support (1) and photosensitive layer (2).

29. A process according to claim 25 wherein on support (1) is present as an underlayer a matte-containing gel layer.

30. A process according to claim 25 wherein the macromolecular organic polymer is gelatin.

31. A process according to claim 25 wherein the monomeric compound is trimethylolpropane triacrylate.

32. A process according to claim 25 wherein the photoinitiator is a 2,4,5-triphenyl-imidazolyl dimer.

* * * * *